(12) United States Patent
Kawase (10) Patent No.: US 6,649,320 B2
(45) Date of Patent: Nov. 18, 2003

(54) DONOR SHEET FOR THIN-FILM FORMATION, PROCESS FOR PRODUCTION THEREOF AND ORGANIC ELECTROLUMINESCENT DEVICE

(75) Inventor: Yoshitaka Kawase, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/076,914

(22) Filed: Feb. 19, 2002

(65) Prior Publication Data

US 2003/0157425 A1 Aug. 21, 2003

(30) Foreign Application Priority Data

Feb. 19, 2001 (JP) .......................... 2001-042033

(51) Int. Cl.[7] .............................. G03F 7/34; G03F 7/11; B41M 3/12; B05D 3/02; B05D 5/06
(52) U.S. Cl. .................... 430/200; 430/201; 430/271.1; 430/935; 118/68; 118/231; 118/235; 118/244; 427/146; 427/377; 427/384; 427/402; 427/407.1; 427/414; 427/417
(58) Field of Search ................. 430/200, 935, 430/271.1, 201; 427/146, 377, 384, 402, 407.1, 414, 417; 118/68, 231, 235, 244

(56) References Cited

U.S. PATENT DOCUMENTS

| | | | | |
|---|---|---|---|---|
| 4,051,278 A | * | 9/1977 | Democh | 430/935 |
| 5,021,808 A | * | 6/1991 | Kohyama | 430/200 |
| 5,441,567 A | * | 8/1995 | Umise et al. | 118/669 |
| 5,871,884 A | * | 2/1999 | Ellis | 430/200 |
| 5,904,961 A | * | 5/1999 | Tang et al. | 430/200 |
| 5,998,085 A | | 12/1999 | Isberg et al. | 430/200 |
| 6,025,110 A | * | 2/2000 | Nowak | 430/200 |
| 6,461,786 B1 | * | 10/2002 | Sasaki et al. | 430/200 |
| 6,534,236 B2 | * | 3/2003 | Wachi et al. | 430/200 |
| 6,555,284 B1 | * | 4/2003 | Boroson et al. | 430/200 |

FOREIGN PATENT DOCUMENTS

| | | |
|---|---|---|
| JP | 10-208881 | 8/1998 |
| JP | 11-260549 | 9/1999 |

* cited by examiner

*Primary Examiner*—Richard L. Schilling
(74) *Attorney, Agent, or Firm*—Nixon & Vanderhye, P.C.

(57) ABSTRACT

A process for producing a donor sheet for a thin-film formation comprising: while transporting a sheet on which a light-to-heat conversion layer has already been formed, forming a transfer layer on the light-to-heat conversion layer and drying the transfer layer.

5 Claims, 5 Drawing Sheets

DONOR SHEET FOR THIN-FILM FORMATION, PROCESS FOR PRODUCTION THEREOF AND ORGANIC ELECTROLUMINESCENT DEVICE

CROSS-REFERENCE TO RELATED APPLICATIONS

This application is related to Japanese, Patent Applications No. 2001-042033 filed on Feb. 19, 2001 whose priorities are claimed under 35 USC §119, the disclosure of which is incorporated by reference in its entirety.

BACKGROUND OF THE INVENTION

1. Field of the Invention

The present invention relates to a donor sheet for a thin-film formation, a process for production thereof and an organic electroluminescent device.

2. Description of the Prior Arts

A thermal transfer process has recently been known as one of the processes for forming a thin film. This process includes fixedly adhering a donor sheet for forming a thin film, that comprises a light-to-heat conversion layer and a transfer layer laminated in this order on a sheet serving as a base material, to a substrate, irradiating laser light from the back- surface of the donor sheet, converting the laser light into heat by the light-to-heat conversion layer, transferring the transfer layer onto the substrate with this heat, and removing then the donor sheet to form a thin film onto the substrate.

The donor sheet has a thin transfer layer on its surface. In order to transport the transfer layer without producing defects onto in the transfer layer, such process has been provided wherein the base material sheet is cut into small pieces before forming the transfer layer, followed by forming the transfer layer onto the base material sheet, and then, the obtained small pieces of the donor sheet are transported after drying. However, this process requires a troublesome process of cutting the base material sheet into small pieces before forming the transfer layer. Further, it takes much time to dry the transfer layer during the formation of the donor sheet that requires a large-sized drying apparatus, to thereby entail a problem of low production efficiency. Additionally, each of the cut small pieces of the donor sheet becomes warped, resulting in entailing a problem that the transfer layer cannot be formed with a uniform thickness.

SUMMARY OF THE INVENTION

In order to solve the above-discussed problems, an object of the present invention is to provide a process for producing a donor sheet for thin-film formation by forming a transfer layer and subsequently drying the transfer layer while transporting a base material sheet.

According to the present invention, since the process does not include complicated steps such as cutting the base material sheet into pieces, the donor sheet can be produced easily with good productive efficiency. Also, since the donor sheet is transported and dried in a state free from warps or distortions, it is possible to form a homogeneous transfer layer with a uniform thickness. Further, since the donor sheet is produced while being transported by transporting rollers, the transfer layer of the donor sheet can be formed and dried in a small production space. Thereby, the present invention has an excellent effect in reducing the size of apparatuses for producing and drying the donor sheet.

The invention provides a process for producing a process for producing a donor sheet for a thin-film formation comprising:

while transporting a sheet on which a light-to-heat conversion layer has already been formed, forming a transfer layer on the light-to-heat conversion layer and drying the transfer layer.

The invention also provides a donor sheet for a thin-film formation manufactured by a process described above.

The invention further provides an organic electroluminescent device formed by using a donor sheet described above.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings that are given by way of illustration only, and thus are not to be considered as limiting the present invention.

DESCRIPTION OF THE PREFERRED EMBODIMENTS

A process of the present invention utilizes a sheet on which a light-to-heat conversion layer has already been formed.

Materials having a function for entirely supporting the donor sheet are used for the sheet. The materials used for the sheet are not specifically limited if they can desirably transmit laser light. For example, a transparent polymer can be used. Examples of the polymer include polyester such as polyethylene terephthalate, polyacryl, polyepoxy, polyethylene, polystyrene, polycarbonate, polysulfone or the like. The shape of the base material sheet is preferably a long band in order to successively forming the transfer layer and drying the resultant. Specifically, the base material sheet having a thickness of about 0.1 to 1.0 mm, a width of about 100 to 1000 mm and a length of about 1000 mm or more (for example, about 1000 to 5000 mm) is preferably used.

A material for the light-to-heat conversion layer used in the process of the present invention is not specifically limited if it can efficiently convert laser light into heat. Examples of the light-to-heat conversion layer include a metal layer comprising aluminum, aluminum oxide and/or aluminum sulfate, or an organic compound layer comprising a polymer to which graphite or infrared absorption dye or the like is added.

The light-to-heat conversion layer can be formed by a known i process. Its thickness is not specifically limited, generally about 10 nm to 10 μm.

Subsequently, a transfer layer is formed-on the sheet.

A material for composing the transfer layer is not specifically limited. For example, an organic electroluminescent material can be used. As the organic electroluminescent material, a light emitting material can be used for forming a light emitting layer of the organic electroluminescent device. A conjugated organic polymer compound or its precursor can be applied, for example, as the light emitting material. Specific examples include PPV or PPV derivative or its precursor, polyfluorene derivative or the like.

Examples of PPV or PPV derivative or its precursor include PPV (poly(p-phenylenevinylene)) and its precursor, MO-PPV (poly(2,5-dimethoxy-1,4-phenylenevinylene)) and its precursor, CN-PPV (poly(2,5-bishexyloxy-1,4-phenylene-(1-cyanovinylene))), MEH-PPV (poly(2-methoxy-5-(2'-ethylhexyloxy))-p-phenylenevinylene) or the like.

Examples of polyfluorene derivative include poly(2,7-(9, 9-di-n-octylfluorene)) or the like.

Among the above-mentioned materials, the PPV derivative are electroconductive polymer having strong fluorescence in which π electrons of double bonds are unlocalized in polymeric chain. It is also possible to a π–π* energy gap by changing a molecular structure by introducting a substituent group. Specifically, the color of emitted light can be changed, to thereby obtain an organic electroluminescent device having high performance. Therefore, the PPV derivative is preferable.

A light emitting material other than the above-mentioned materials or dopant material can be used for the organic electroluminescent material. Examples of such material include metal oxynoide compound (8-hydroquinoline metal complex), butadiene derivative, coumarine derivative, dicyanomethylene pyrane derivative, fluorescein derivative, perylene derivatives perynone derivative, aminopyrene derivative, benzoxazole derivative, oxadiazole derivative, oxazole derivative, thiadiazole derivative, styrylamine derivative, bisstyrylbenzene derivative, tris-styrylbenzene derivative or the like.

As an organic electroluminescent material, a hole injecting/transporting material can be used in order to form a hole injecting/transporting layer. Any optional material can be selected to be used, as the hole injecting/transporting material, among the known materials generally used as a hole charge transporting material in a photoconductive material or used for a hole transporting material of a electorluminescent device. The material is not specifically limited. Examples of the material include organic polymer compound such as polyvinylcarvazole, polysilane, polythiophene derivative, PPV(poly(p-phenylenevinylene)) derivative or the like, and besides these, a low-molecular compound such as triazole derivative, oxadiazole derivative, imidazole derivative, polyallylalkane derivative, pyrazoline derivative, pyrazolone derivative, phenylenediamine derivative, biphenylenediamine derivative, binaphthylenediamine derivative, arylamine derivative, oxazole derivative, sytrilanthracen derivative, fluorenone derivative, hydrazone derivative, stilbene derivative or the like.

An additive having a function of increasing the hole injection and transportation may be added to these hole injecting/transporting materials.

As an organic electroluminescent material, an electron injecting/transporting material can be used in order to form an electron injecting/transporting layer. Any optional material can be selected to be used, as the electron injecting/transporting material, among the known materials generally used as a electron charge transporting material in the photoconductive material or used for an electron transporting material of a electorluminescent device. The material is not specifically limited. Examples of the material include a organic polymer compound such as PPV (poly(p-phenylenevinylene)) derivative or the like, and besides that, oxadiazole derivative, triazole derivative, benzoquinone derivative, naphthoquione derivative, anthraquinone derivative, tetracyanoanthuraquinodimethane derivative, diphenoquinone derivative, fluorenone derivative, metal oxinoide compound or the like.

An additive having a function of increasing the electron injection and transportation may be added to these electron injecting/transporting materials.

The above-mentioned organic electroluminescent materials may singly be used or may be used by mixing with other compounds. Most preferable one is a macromolecular material having a organic polymer compound as its main component.

The organic electroluminescent material can be coating solution for forming the transfer layer by dissolving the organic electroluminescent material into a solvent.

Materials composing the transfer layer are dissolved in the solvent, and the resultant is used as the coating solution. The solvent is optionally selected depending upon the used material. Examples of the solvent include alcohol such as methanol, ethanol or the like, organic solvent generally used in this field such as toluene, xylene or the like and water.

The coating solution for forming the transfer layer may have an additive incorporated therein. Examples of the additive include photo-stabilizer, anti-oxidant, pH adjuster, antiseptic, structural stabilizer, or the like. The addition of such additives can enhance the durability of the transfer layer, thus preferable.

The transfer layer can be formed on the base material sheet with a general film coating process such as extrusion coating, spin coating, gravure coating, reverse roll coating, rod coating, microgravure coating or the like. In this case, the base material sheet is not cut off into small pieces, i.e., the long band-like shape is maintained, and the transfer layer is formed on the base sheet material at this position or the transfer layer is formed with the base material sheet transported.

It is preferable in the coating process of the transfer layer that static electricity charged on the surface of the base material sheet is neutralized for uniformly applying the coating solution for the transfer layer formation on the base material sheet. In view of this, a charge neutralizer is preferably mounted to a device used in each process.

Although not specifically limited, the transfer layer is formed to have a thickness of about 10 nm to 10 μm.

A thermal transmission layer and/or release layer may be formed between the light-to-heat conversion layer and the transfer layer. Examples- of the material for forming the thermal transmission layer and or the release layer include poly-α-methylstyrenic acid or the like. Although not specifically limited, the thermal transmission layer and the release layer is formed to have a thickness of about 1 μm.

According to the present invention, the transfer layer is formed while transporting the base material sheet, which is not cut into small pieces but in a long-belt form.

Figure 3:
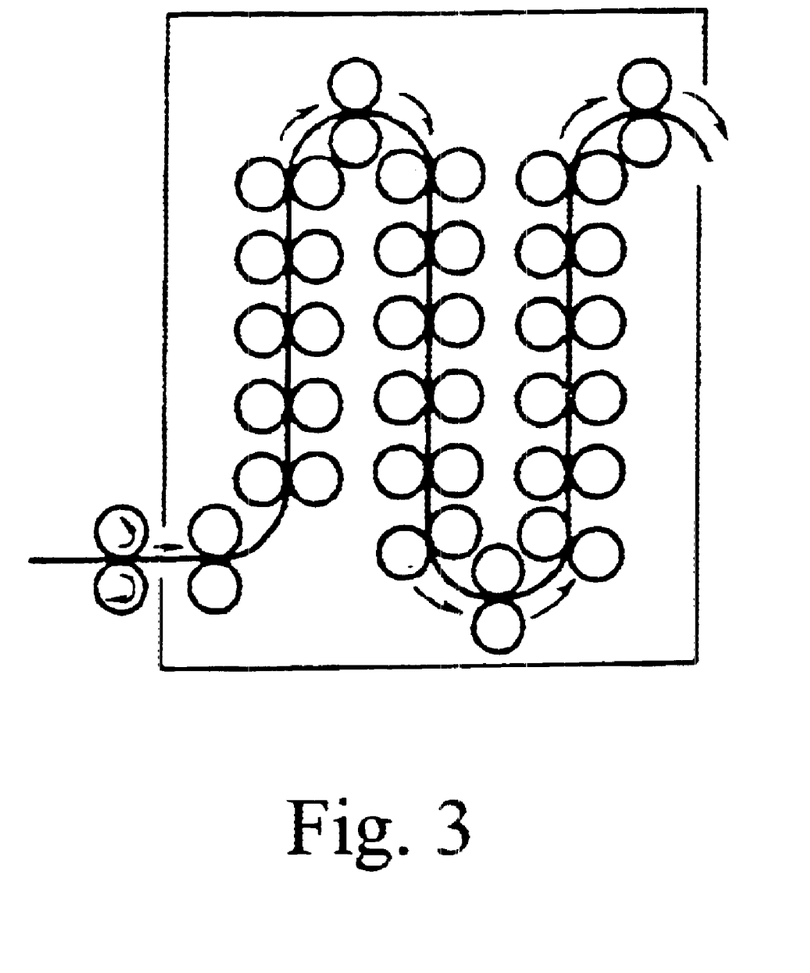
FIG. 3 is a schematic constructional view of a donor sheet transport of the present invention.

The transportation of the donor sheet may be made, in the process of the present invention, by rotating the transporting roller that is in contact with the donor sheet or by using a transporting device such as a belt conveyer. The use of the transporting roller is preferable since it is simple in construction and the transfer layer is easy to be dried (see FIG. 3).

Figure 2A:
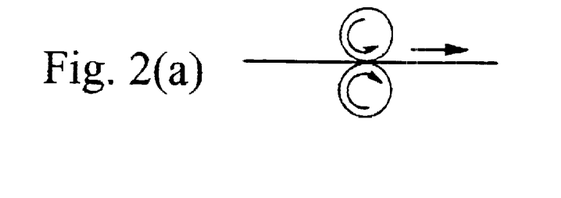
FIG. 2 is a view for explaining a transporting roller for the donor sheet of the present invention.
Figure 2B:
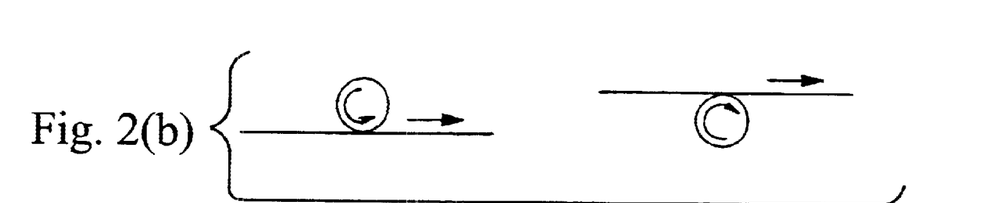
Figure 2C:
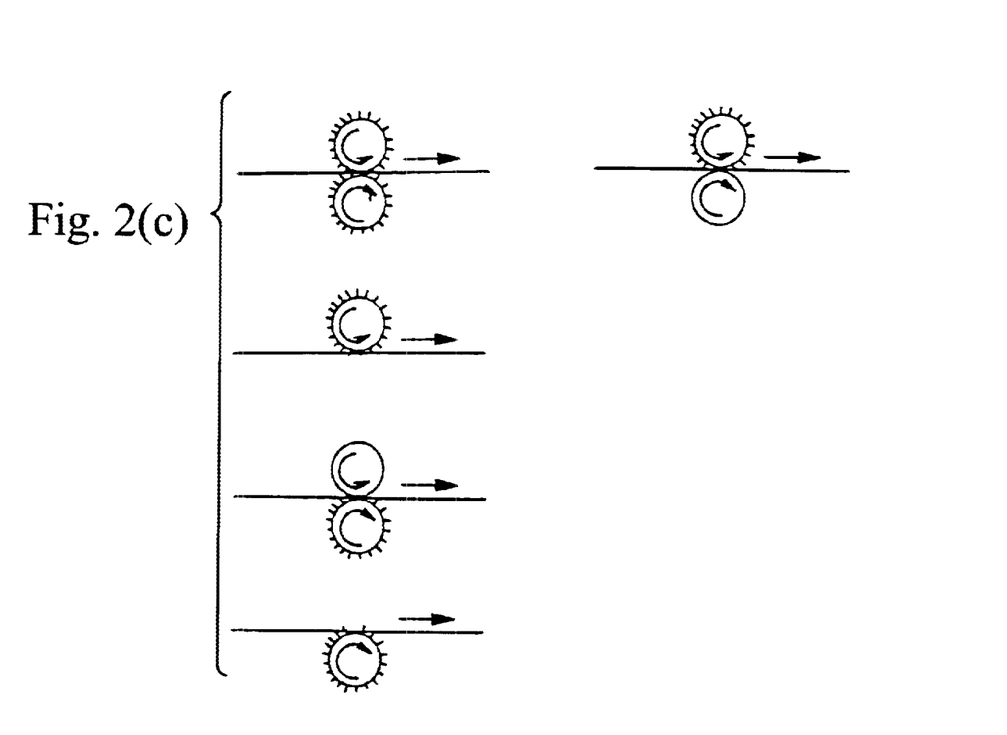

The transportation of the donor sheet is specifically made by the respective following processes. The first process includes sandwiching the sheet by two transporting rollers and rotating the transporting rollers in the transporting direction as shown in FIG. 2(a). The second one includes causing both edges of the donor sheet to be in contact with two respective transporting rollers at the upper side or lower side of the sheet and rotating the transporting rollers in the transporting direction as shown in FIG. 2(b). The next process includes punching holes on both edges or one edge of the donor sheet, causing one or more transporting rollers having projections engaged with the holes of the donor sheet to be in contact with the both edges or one edge of the donor sheet at the upper or lower sides or only upper side or only lower side of the donor sheet so as to engage the projections of the transporting roller into the holes on the donor sheet and rotating the transporting roller in the transporting direction as shown in FIG. 2(c).

Figure 2D:
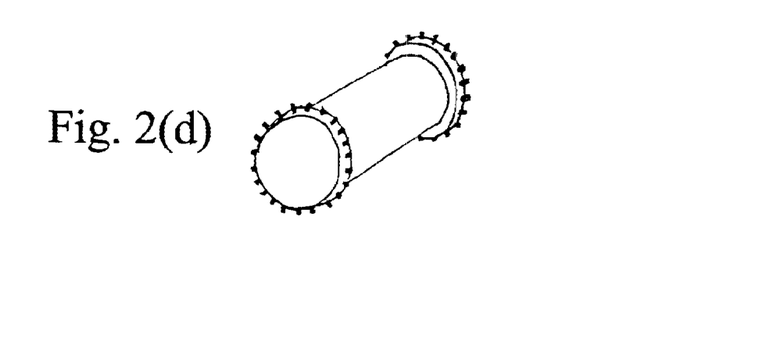

The use of a transporting roller, both edges of which have a maximum diameter and have projections formed thereon, can transport the sheet with one transporting roller as shown in FIG. 2(d). This means that the donor sheet is not required to be transported with respective two transporting rollers. Further, the use of this transporting roller is preferable since the donor sheet can be transported without giving damage on the surface of the transfer layer by the friction of the transporting roller.

The number of the transporting roller is not specifically limited. For example, the number of the transporting roller can suitably be adjusted depending upon the drying condition of the transfer layer described later.

The solvent in the transfer layer is removed and dried by, for example, heating the transfer layer formed on the donor sheet in the process of the present invention. The transfer layer is formed by applying the coating solution, so that the solvent generally remains in the layer. Therefore, the transfer layer is dried by using a heating source such as a heater for removing the solvent.

Although the drying process of the transfer layer may be performed during the transportation of the donor sheet or after cylindrically rolling the donor sheet, the former is preferable since the drying process is speedily facilitated.

In case where the material included in the transfer layer is weak against the air component or water component, the inherent characteristic is damaged when the transfer layer is dried in the atmosphere. In order to prevent this state, the transfer layer is preferably dried in inert gas atmosphere. Examples of the inert gas include rare gas or nitrogen gas.

An electric heater can be used, for example, as the heating means for drying the transfer layer. This heating means is preferably mounted along the transported donor sheet at the transfer layer side of the donor sheet as shown-in FIG. 1(b).

The transporting roller for transporting the donor sheet used in the process of the present invention may also have the heating means. In that case, the transfer layer can effectively be dried during the transportation of the sheet. This can shorten the transporting distance, thereby making the producing and drying device of the donor sheet small. Therefore, the transporting roller having the heating means is preferable. The transporting roller with the heating means preferably has a uniform temperature in the axis direction. In case where the heat emitted from the transporting roller can be transmitted to the donor sheet, the surface of the axis of the transporting roller does not have to be in contact with the sheet.

The setting temperature of the heating means is not specifically limited since it is different depending upon the boiling point of the solvent. The preferable temperature is generally about 100° C. to 200° C.

The preferable transporting state in the process of the present invention is to transport the donor sheet as it is stuck by suction to the transporting roller. For example, the transporting roller is caused to stuck the donor sheet from the backside thereof by using an suction apparatus such as a compressor. Alternatively, the transporting roller is caused to adsorb the donor sheet by applying an adsorbent (e.g., an adhesive or the one obtained by foam-processing synthetic resin) on the back surface of the donor sheet or on the surface of the transporting roller. The transportation of the donor sheet as it is stuck by suction to the transporting roller is preferable, since such transportation can prevent the deformation or wrinkle from being produced on the donor sheet during the transportation, thereby establishing an accurate transportation.

The donor sheet having the transfer layer dried by the process of the present invention is further transported and wound around I the preserving roller for preservation or transported to the next step as the need arises.

Figure 7A:
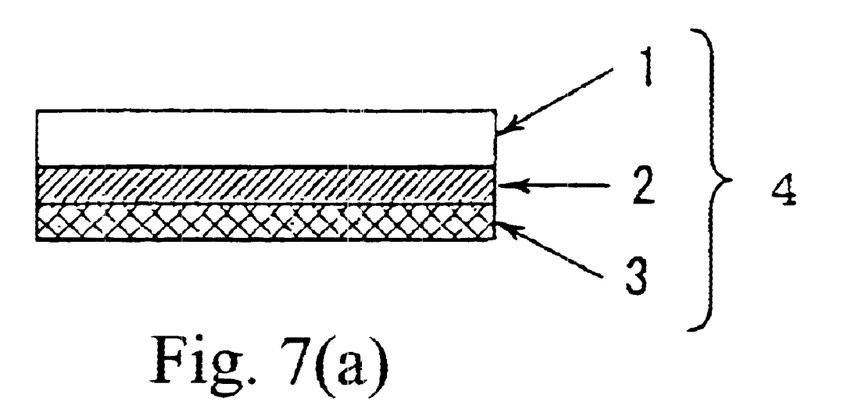
FIG. 7 is a typical sectional view for explaining a process for producing an organic EL device of the present invention.

The obtained donor sheet has a structure in which at least a light-to-heat conversion layer 2 and a transfer layer 3 are successively laminated on the surface of the base material sheet 1 as shown in FIG. 7.

In the present invention, an organic electroluminescent device can be manufactured by using the donor sheet manufactured by the above-mentioned process.

Figure 7B:
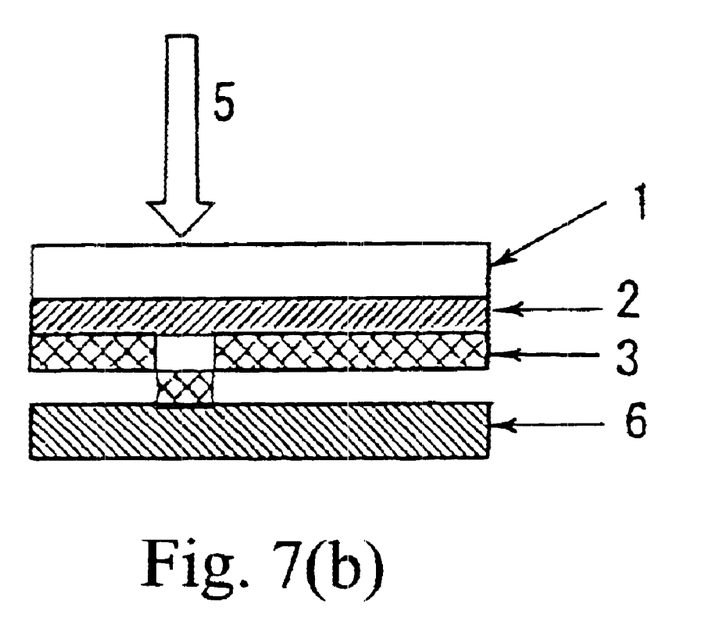

Specifically, a material composing a first electrode is deposited on the base material. The deposited material is patterned into a desired shape to form the first electrode. Thereafter, a thin film-comprising an organic electroluminescent material is formed by a laser transferring process on the base material having the first electrode formed thereon. Subsequently, a second electrode is patterned into a desired shape, to thereby obtain the organic electroluminescent device. The laser transferring process includes, as shown in FIG. 7(b), irradiating laser 5 from the side of the base material sheet 1 that is opposite to the transfer layer 3 of the donor sheet and converting light into heat at the light-to-heat conversion layer 2 for thermally transferring the transfer layer 3 from the donor sheet to a substrate 6.

A material that transmits visible light (i.e., a transparent material) is desirable for the material composing the substrate. Specific examples of the material include a glass such as boron silicate glass, quartz, transparent plastic or the like.

Examples of the material composing the first electrode include a transparent conductive film such as CuI, ITO, $SnO_2$, ZnO or the like. The use of the ITO having a sheet resistance of about 5 to $20\Omega/\square$, specifically about $10\Omega/\square$ preferable in order to manufacture a simple matrix type display panel. The first electrode can be formed by a known process, for example, by a photolithography, to be patterned into a desired shape.

The transfer layer formed by the donor sheet includes at least a light emitting layer, and preferably includes a hole injecting/transporting layer and/or electron injecting/transporting layer laminated. The respective materials composing the light emitting layer, hole injecting/transporting layer and electron injecting/transporting layer are as described above.

The light emitting layer may be a single layer or a laminate structure having two or more layers. Its thickness is preferably about 1 nm to 1 μm in general.

The hole injecting/transporting layer may be a single layer or a laminate structure having two or more layers. Its thickness is preferably about 1 nm to 1 μm in general.

The electron injecting/transporting layer may be a single layer or a laminate structure having two or more layers. Its thickness is preferably about 1 nm to 1 μm in general.

The material composing the second electrode is not specifically limited if it can inject charge into an organic compound layer. Examples of the material include magnesium, aluminum, aluminum/lithium alloy or the like. The second electrode can be formed by a known process, for example, by a vapor-deposition process.

Figure 4:
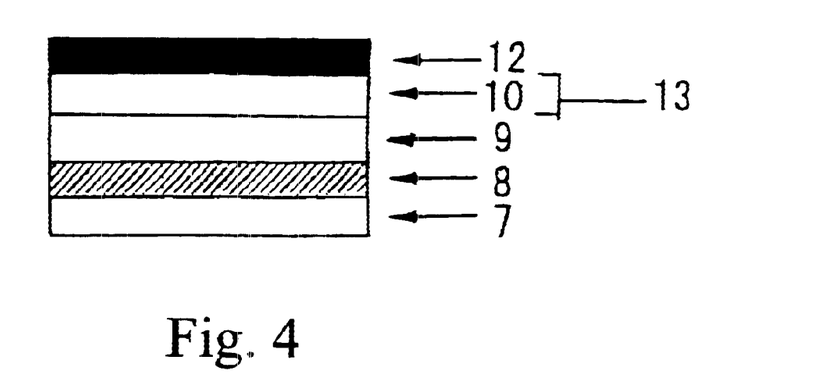
FIG. 4 is a typical sectional view of an organic EL (electroluminescent) device according to the present invention.
Figure 5:
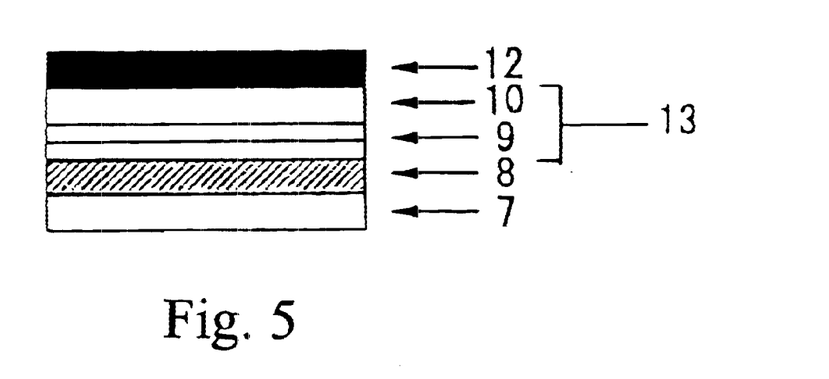
FIG. 5 is a typical sectional view of an organic EL device according to the present invention.
Figure 6:
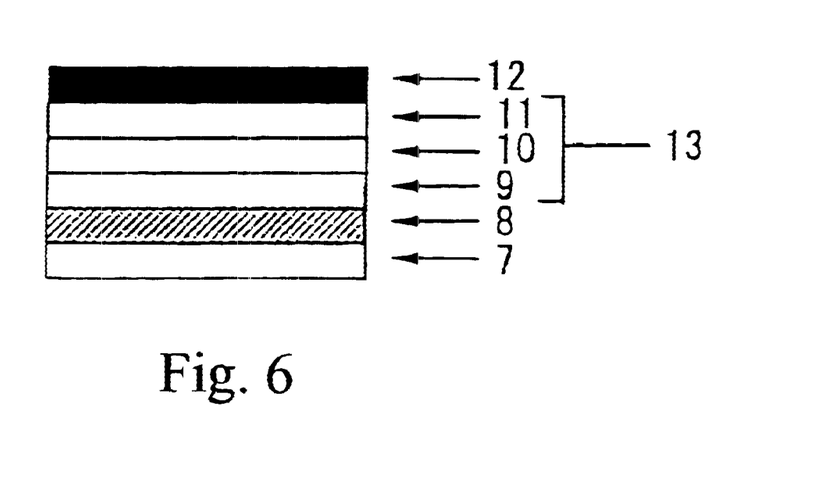
FIG. 6 is a typical sectional view of an organic EL device according to the present invention.

FIGS. 4, 5 and 6 illustrate respectively a typical sectional view of a pixel in an organic field emission panel taken as a specific example of the organic electroluminescent device manufactured by using the donor sheet of the present invention.

A hole transporting layer 9 in the structure shown in FIG. 4 has a function for transmitting the hole injected from a first electrode 8 to a light emitting layer 10. This structure is preferable since it improves the hole injecting efficiency from the hole transporting layer 9 to the light emitting layer 10, resulting in being capable of enhancing the emission brightness and emission efficiency.

FIG. 5 shows that the hole transporting layer 9 has a two-layered structure. This structure has a layer (hole injecting layer) that injects the hole from the first electrode 8, and a layer (hole transporting layer) that transports the hole, whereby the hole can efficiently be transmitted to the light emitting layer 10.

FIG. 6 shows that an electron transporting layer 11 is formed besides the hole transporting layer 9. The electron transporting layer 11 has a function to transmit the electron injected from a second electrode 12 to the light emitting layer 10. This structure improves the electron injecting efficiency from the electron transporting layer, 11 to the light emitting layer, thereby being capable of enhancing the emission brightness and emission efficiency.

Making the organic electroluminescent device having a multi-layered structure as described above can prevent the reduction in brightness and lifetime that is caused by a quenching.

The donor sheet for forming a thin film in the present invention can be applied as thin-film forming means such as, for example, the formation of an organic layer in an organic LED display or the formation of a color filter in a liquid crystal display, in addition to the manufacture of the organic electroluminescent device. This can produce a thin-film device with excellent production efficiency.

One embodiment of an organic thin film forming process using the process of the present invention will be explained hereinafter, by which the present invention is not limited.

EXAMPLE 1

Figure 1A:
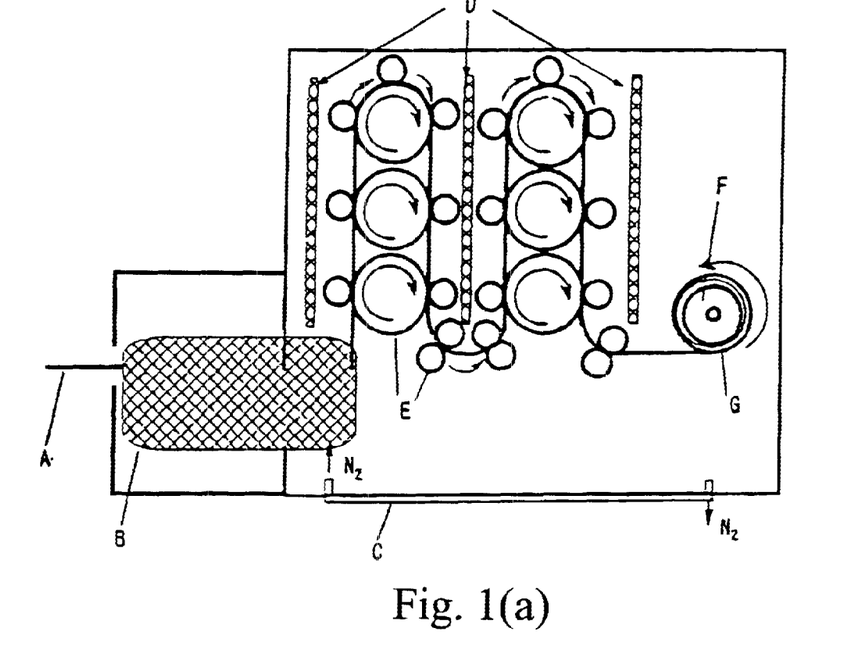
FIG. 1 is a typical view showing a transporting process and drying process of a donor sheet according to the present invention.
Figure 1B:
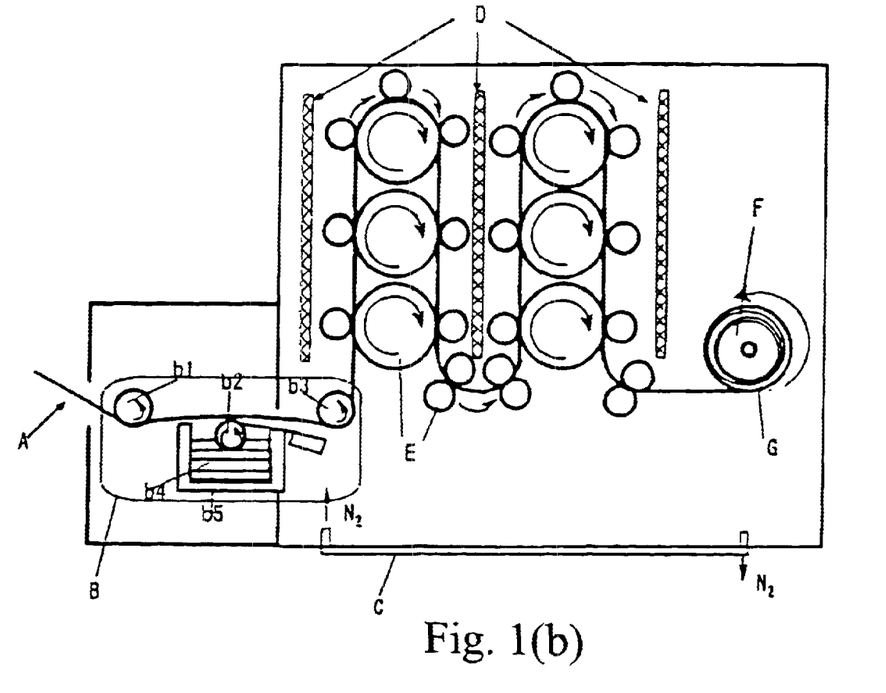

FIG. 1(*a*) is a schematic structural view of a main part of a device for transporting and drying a donor sheet, while FIG. 1(*b*) is a schematic structural view of a main part of a device for forming a transfer layer with a base material sheet transported and drying the base material sheet. This embodiment will be explained in detail with reference to FIG. 1(*b*).

The donor sheet was formed as follows. Specifically, polyethylene terephthalate film having a thickness of about 0.2 mm, width of about 300 mm and length of about 2000 mm was used as the base material sheet. Thermosetting epoxy resin including carbon black was coated to be cured on this film with a thickness of about 5 microns. This epoxy resin serves as a layer for converting laser light into heat (light-to-heat conversion layer). Then, poly-α-methylstyrenic acid serving as a thermal transmission layer and release layer was coated on the light-to-heat conversion layer with a thickness of about 1 micron. Applied onto the poly-α-metylstyrenic acid was coating solution b4 for forming the transfer layer. Thus, the donor sheet was obtained.

FIG. 1(*b*) shows a solution coating means B for forming the transfer layer onto the base material sheet A. The coating solution b4 stored in advance in a coating solution reservoir b5 was applied onto the base material sheet A by rotating a roller b1, a roller b2 dipped into the coating solution b4 and a roller 3, whereby the transfer layer was formed. The coating process was performed by a microgravure process as described above.

The used coating solution 4*b* was obtained by dissolving 5 g of cyanopolyphenylenvinylene (CN-PPV, shown in the [formula (I)] in 1 L of xylene.

The thickness of the coated film can suitably be adjusted by controlling the rotating speed of each roller b1, b2 and b3, whereby the thickness of the transfer layer can be adjusted within the range of about 10 nm to 10 μm.

Subsequently, the donor sheet on which the transfer layer was formed was discharged from the solution coating means B with the rotation of each roller b1, b2 and b3, and then, transported with a predetermined transport speed with the rotation of a roller E. Nitrogen gas was flown in a constant flow rate into the transport path from a nitrogen gas supply/discharge tube C. Mounted in the transport path was heating means D for drying the transfer layer on the donor sheet. A donor sheet G having the dried transfer layer was further transported and wound around donor sheet rolling means F.

Both edges of the donor sheet having the transfer layer formed thereon were punched to have holes at a predetermined space. The roller E had projections engaged with these holes at the surface of both edges [see FIG. 2(*d*)].

A heater was incorporated in the roller E in order to speedily dry the transfer layer and thereby shortening the transport distance of the donor sheet after forming the transfer layer.

The temperature of each heater D and roller E was kept at about 150° C. during the transportation, and dried nitrogen gas was circulated in the device, to thereby dry the transfer layer.

When the rolled donor sheet was measured by a stepmeter (surface roughness tester), it was found that a satisfactory transfer layer having no thickness variation on the entire surface could be continuously obtained.

EXAMPLE 2

A donor sheet was manufactured by the same manner as in Example 1 except for the following point. Specifically, the roller E positioned at the back side of the transfer layer on the donor sheet was made such that a layer on which acrylic resin was subject to a foam process was coated on the surface of the roller in order to efficiently transport the donor sheet.

When the rolled donor sheet was measured by a stepmeter, it was found that a satisfactory transfer layer having no thickness variation on the entire surface could be continuously obtained.

EXAMPLE 3

Washing a transparent electrode of the substrate

ITO (indium tin oxide) having a sheet resistance of 15Ω/□ was patterned into a stripe with a width of 75 μm on a glass substrate with a thickness of about 1600 Å, thus obtaining a transparent electrode. The glass substrate having the transparent electrode formed thereon was subject to ultrasonic cleaning with a surface active agent, water and isopropanol, then dried, and further washed for 30 minutes by utilizing a ultraviolet irradiating system (excimer lamp 172 nm ($Xe_2^*$), radiant illumination 10 mW/cm$^2$).

Producing of the Donor Sheet

A donor sheet was manufactured by the same manner as in Example 1 except that PEDOT/PSS water solution (polyethylene dioxythiophene-doped polystyrene sulfonate, shown in [Formula (II)] including 1.2 wt % of solid was prepared for forming a PEDOT/PSS layer serving as the transfer layer with a thickness of about 100 nm.

(II)

PEDOT                PSS (Producing Organic Electroluminescent Device)

The obtained donor sheet was fixedly adhered to the transparent electrode such that the PEDOT/PSS layer (transfer layer) was in contact with the transparent electrode. Then, laser light was irradiated in parallel to the ITO stripe from the side opposite to the side of the base material sheet on which the transfer layer was formed, to thereby form the PEDOT/PSS layer on the transparent electrode. Subsequently, CN/PPV layer (light emitting layer) was similarly formed on the PEDOT/PSS layer with a thickness of about 10 nm by using the donor sheet obtained in Example 1. Nd-YAG 8 W laser light having a beam size of about 100 μm($1/e^2$) was used as the laser light. Ca was vapor-deposited on the CN-PPV layer (light emitting layer) with a thickness of about 40 nm so as to be at right angles to the ITO electrode, and then, Ag was vapor-deposited thereon with a thickness of about 150 nm, to thereby form the second electrode. Thus, the organic electroluminescent device was completed. The vapor depositions of Ca and Ag were performed under the conditions as follows: ultimate vacuum: $3 \times 10^6$ Torr, base material temperature: room temperature, deposition speed: Ca=2 to 3 Å/sec, Ag 4 to 5 Å/sec.

The transparent electrode of the obtained organic electroluminescent device was rendered to be anode while the second electrode thereof was rendered to be cathode. Direct current was applied between both electrodes at room temperature in the atmosphere for emitting the light emitting layer. Measuring the emission brightness of the light emitting layer by a brightness meter, red emission of about 100 cd/m$^2$ was observed with a driving voltage of 8 V.

The process of the present invention can form and dry a transfer layer with a sheet being transported, whereby a uniform transfer layer can be obtained. Further, the process of the present invention can provide a satisfactory production efficiency since it does not include a troublesome process of cutting a base material sheet into small pieces, thereby being capable of producing a donor sheet in a simple way. The donor sheet is transported and dried without causing a warp or deformation thereon, to thereby be capable of forming a donor sheet having a homogenous and uniform thickness. The donor sheet is manufactured while being transported by a roller, so that the transfer layer can be formed and dried even in a narrow space. This can promote downsizing of a device for producing and drying the donor sheet.

The use of the donor sheet obtained by this process can manufacture an organic electroluminescent device having a uniform organic layer with a simple process.

What is claimed is:

1. A process for producing a donor sheet for a thin-film formation comprising:

while transporting a sheet on which a light-to-heat conversion layer has already been formed, forming a transfer layer on the light-to-heat conversion layer and drying the transfer layer, the sheet being transported by rotating a transporting roller in contact with the sheet, the sheet being transported by engaging holes in both edge portions of the sheet with projections arranged intervals on the transporting roller.

2. A process for producing a donor sheet for a thin-film formation comprising:

while transporting a sheet on which a light-to-heat conversion layer has already been formed, forming a transfer layer on the light-to-heat conversion layer and drying the transfer layer, the sheet being transported by rotating a transporting roller in contact with the sheet, the sheet being transported as it is stuck by suction to the transporting roller.

3. A process for producing a donor sheet for a thin-film formation comprising:

while transporting a sheet on which a light-to-heat conversion layer has already been formed, forming a transfer layer on the light-to-heat conversion layer and drying the transfer layer the sheet being transported by rotating a transporting roller in contact with the sheet, and drying the transfer layer by a heater incorporated in the transporting roller.

4. A process for producing a donor sheet for a thin-film formation comprising:

while transporting a sheet on which a light-to-heat conversion layer has already been formed, forming a transfer layer on the light-to-heat conversion layer and drying the transfer layer: and drying the transfer layer under an inert gas atmosphere.

5. A process for producing a donor sheet according to claim 1, wherein the holes are arranged at regular intervals in both edge portions of the sheet and the projections are arranged at regular intervals on the transporting roller.

* * * * *